United States Patent
Yamaguchi et al.

(10) Patent No.: US 6,723,382 B2
(45) Date of Patent: Apr. 20, 2004

(54) METHOD FOR FABRICATING CERAMIC MATRIX COMPOSITE

(75) Inventors: Hirohide Yamaguchi, Saitama (JP); Takeshi Nakamura, Tokyo (JP); Hiroshige Murata, Funabashi (JP)

(73) Assignee: Ishikawajima-Harima Heavy Industries Co., Ltd., Tokyo (JP)

( * ) Notice: Subject to any disclaimer, the term of this patent is extended or adjusted under 35 U.S.C. 154(b) by 0 days.

(21) Appl. No.: 10/118,087

(22) Filed: Apr. 8, 2002

(65) Prior Publication Data

US 2003/0008067 A1 Jan. 9, 2003

(30) Foreign Application Priority Data

Jul. 4, 2001 (JP) .................... P2001-203974

(51) Int. Cl.[7] .............................................. C23C 16/00
(52) U.S. Cl. .................... 427/249.2; 427/900
(58) Field of Search .................... 427/249.2, 900, 427/255.12

(56) References Cited

U.S. PATENT DOCUMENTS

| | | | | |
|---|---|---|---|---|
| 6,120,840 A | * | 9/2000 | Paul et al. | .................... 427/226 |
| 6,316,048 B1 | * | 11/2001 | Steibel et al. | ................ 427/180 |
| 6,331,496 B2 | * | 12/2001 | Nakayasu | .................. 501/95.2 |
| 6,342,269 B1 | * | 1/2002 | Yoshida et al. | ......... 427/255.12 |
| 6,368,663 B1 | * | 4/2002 | Nakamura et al. | ........ 427/248.1 |

FOREIGN PATENT DOCUMENTS

| | | |
|---|---|---|
| EP | 1 024 121 A2 | 8/2000 |
| JP | Sho 63-12671 | 1/1988 |
| JP | Hei 7-291749 | 11/1995 |
| JP | 2000-219576 | 8/2000 |
| WO | WO 94/15887 | 7/1994 |

OTHER PUBLICATIONS

Suzuki et al., "Fabrication and Characterization of 3D Carbon Fiber Reinforced Sic Matrix Composites Via Slurry and Pulse–Cvi Joint Process," Ceramic Engineering and Science Proceedings, Columbus, U.S., vol. 19, No. 3, 1998, pp. 259–266, XP000800247.

* cited by examiner

Primary Examiner—Bret Chen
(74) Attorney, Agent, or Firm—Fish & Richardson P.C.

(57) ABSTRACT

A method for fabricating a CMC (Ceramic Matrix Composite) article, comprising: performing a CVI (Chemical Vapor Infiltration) treatment for forming a SiC matrix layer on the surface of a woven fabric; performing a machining process, after the CVI treatment, for machining the woven fabric; and performing a PIP (Polymer Impregnation and Pyrolysis) treatment, after the machining process, for impregnating an organic silicon polymer as a base material into voids in the matrix layer and pyrolyzing the organic silicon polymer. By this method, the throughput of CMC articles can be preferably increased. The throughput may be further increased by performing a slurry impregnation treatment before or after the PIP treatment, in which slurried SiC is impregnated into the voids in the matrix layer.

4 Claims, 2 Drawing Sheets

METHOD FOR FABRICATING CERAMIC MATRIX COMPOSITE

BACKGROUND OF THE INVENTION

1. Field of the Invention

The present invention relates to an improved method for fabricating a fiber-reinforced ceramic matrix composite, and more particularly, relates to a method for fabricating an article in a short period by impregnating a matrix substance.

2. Background Art

In order to increase performance of a rocket engine consuming, as fuel, $NTO/N_2H_4$, NTO/MMH, and the like, it is necessary that the combustion chamber (thrust producing chamber) of the rocket engine have extremely high thermal resistance. A niobium alloy, with a coating, able to resist temperatures of up to about 1,500° C. has been used for forming combustion chambers of numerous rocket engines so as to meet the thermal requirement. On the other hand, drawbacks of this material are that it is heavy due to its high density and that it exhibits low strength at high temperature, and in addition, the service life of its coating is relatively short.

Although ceramics exhibit excellent thermal resistance, they are brittle. In order to overcome the defect, a ceramic matrix composite reinforced with ceramic fibers (hereinafter abbreviated as CMC) has been developed. A CMC consists of ceramic fibers and a ceramic matrix. A CMC is generally specified in the form of ceramic fibers/ceramic matrix. For example, if a CMC consists of a ceramic fiber of silicon carbide (hereinafter abbreviated as SiC) and a ceramic matrix of SiC, this CMC is specified as SiC/SiC.

Because CMC is relatively light and has superior thermal resistance, it may be preferably used not only in combustion chambers (thrust producing chambers) in rocket engines described above, but also in fuel pipes which will be exposed to high temperatures, turbine blades in jet engines, combustion chambers thereof, and afterburner parts thereof.

On the other hand, CMCs tend to fail to be airtight and to exhibit low thermal shock resistance. When a CMC is used as a material for an article, first, the shape of the article is created with ceramic fibers, and then a matrix is formed in the voids among the fibers by chemical vapor infiltration (hereinafter abbreviated as CVI treatment). It takes a long time, e.g., more than a year, which is impractical, to completely fill the voids by a CVI treatment, which is a serious problem. If the article made of an ordinary CMC by the above method is tested at a high temperature and is exposed to a severe thermal shock, e.g., a temperature difference of more than 900° C., the strength of the article is drastically reduced, and consequently, the article cannot be used. Therefore, it has been generally believed that an ordinary CMC is not suitable for elements such as combustion chambers (thrust producing chambers) and fuel pipes which must provide both airtight performance and thermal shock resistance.

Japanese Unexamined Patent Application, First Publication, No. 2000-219576 discloses a fabrication method for overcoming the above problem. This method uses a treatment consisting of polymer impregnation and pyrolysis (hereinafter abbreviated as PIP treatment). The method comprises the steps of shaping a woven fabric into the desired shape of an article; forming a SiC matrix layer on the surface of the woven fabric by a CVI treatment; impregnating an organic silicon polymer, as a base material, into voids in the matrix layer, and pyrolyzing the organic silicon polymer by a PIP treatment. Because a matrix is formed more quickly by a PIP treatment than by a CVI treatment, and because a PIP treatment can be repeatedly performed in a short period, the remaining voids in the matrix layer after a CVI treatment can be completely filled by repeated PIP treatments, whereby airtightness of the article is improved. Since the matrix formed by PIP treatments has microcracks and the binding force among the ceramic fibers is relatively low, the Young's modulus of the CMC is reduced when a PIP treatment is performed in addition to a CVI treatment than when only a CVI treatment is applied for forming the CMC as was usual. As a result, thermal stress is reduced and thermal shock resistance can be much improved.

In such known processes for fabricating an article with CMC, the shape of the article is formed by machining after a sufficient density of the matrix layer is achieved by a PIP treatment, and then finally another coating process is performed by a CVI treatment. For example, in the case of fabricating a chamber of a rocket engine and the like as the article, the chamber must have a high degree of airtight performance, i.e., must achieve so-called no-leak performance upon completion in order to prevent combustion gas from escaping. In order to meet the no-leak requirement, a leak test is performed after coating by a CVI treatment, and depending on the leak test result, further PIP treatments and coating processes by CVI treatments may be repeated as necessary.

The conventional method for fabricating a CMC above described, however, includes some drawbacks as follows.

Since the voids in the woven fabric are filled or covered by the matrix layer formed near the outer surface of the woven fabric through the CVI treatment, a polymer cannot be easily impregnated into inside the woven fabric during the PIP treatment. Because of this, the PIP treatments must be performed up to 30 to 40 times in order to achieve a desired density of the polymer by filling the polymer, and thus to achieve no-leak performance, which means that throughput is very low.

SUMMARY OF THE INVENTION

Based on the above problem, an object of the present invention is to provide a method for fabricating a CMC article by which throughput of the CMC articles is increased.

In order to achieve the above object, the method according to the present invention provides the following.

A method, according to a first aspect of the present invention, for fabricating a CMC article, comprises performing a CVI treatment for forming a SiC matrix layer on the surface of a woven fabric; performing a machining process, after the CVI treatment, for machining the woven fabric; and performing a PIP treatment, after said machining process, for impregnating an organic silicon polymer as a base material into voids in the matrix layer, and pyrolyzing the organic silicon polymer.

In the above method, the matrix layer, which is formed in an outer portion of the woven fabric by the CVI treatment and covers the voids, can be removed by the machining process. As a result, impregnation paths are preferably provided in the PIP treatment, through which an organic silicon polymer can be easily impregnated into the inside portion of the woven fabric; thus, the number of the repeated PIP treatments may be reduced.

In a method according to a second aspect of the present invention for fabricating a CMC article, in addition to the processes in the first aspect, the woven fabric is machine-finished into a desired shape in the machining process.

In the above method, because the matrix layer, which is formed in outer portion of the woven fabric and covers the voids, can be removed and the woven fabric is machine-finished into a desired shape, another finishing process after the PIP treatment is not required.

A method, according to a third aspect of the present invention, for fabricating a CMC article, in addition to the processes in the first or second aspect, further comprises performing a slurry impregnating process before or after the PIP treatment for impregnating SiC in a slurry state into voids in the matrix layer.

In the above method, the filling factor can be efficiently increased, and consequently, the number of the repeated PIP treatments may be further reduced.

DETAILED DESCRIPTION OF THE PREFERRED EMBODIMENTS

Figure 1:
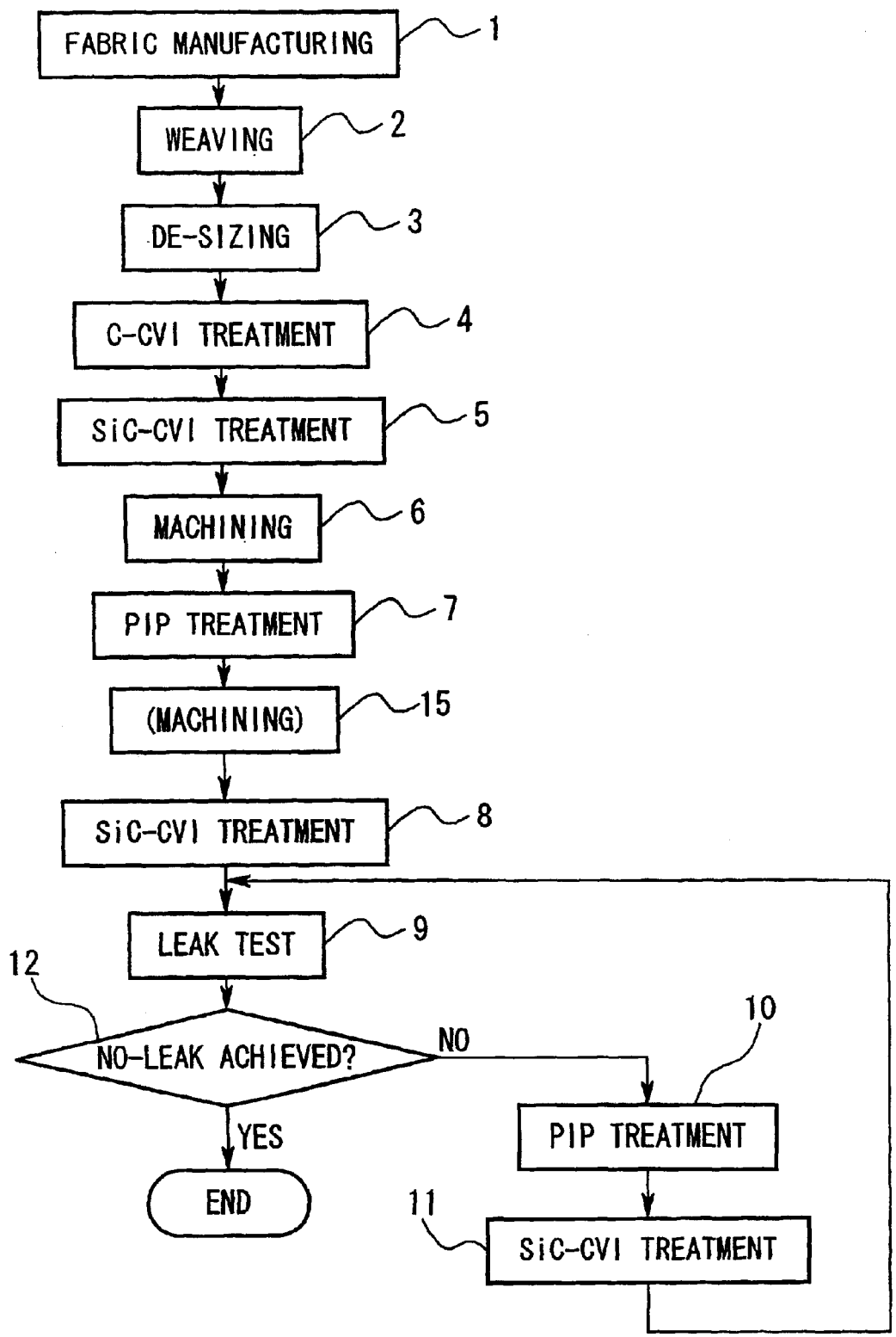
FIG. 1 is a flow diagram showing a method for fabricating a CMC article according to the first embodiment of the present invention.

The preferred embodiments of the present method for fabricating a CMC article will be explained with reference to the accompanying drawings. FIG. 1 is a flow diagram showing a method for fabricating a CMC article according to the present invention.

As shown in FIG. 1, a method according to the present invention is applied to a fabrication method, in part, comprising: fabric manufacturing 1, weaving 2, de-sizing 3, i.e., removing a sizing agent, C-CVI (carbon-CVI) treatment 4, SiC-CVI treatment 5, machining 6, PIP treatment 7, SiC-CVI treatment 8, leak test 9, PIP treatment 10 depending on the result of the leak test, and SiC-CVI treatment 11. Each of these processes will be explained below.

In the fabric manufacturing process 1 and weaving process 2, a SiC fabric is processed into a woven fabric having a desired shape. The shape of the woven fabric formed in the weaving process 2 preferably corresponds to a 3-D shape which matches a desired article such as a combustion chamber (thrust producing chamber) in a rocket engine, a fuel pipe to be exposed to high temperatures, a turbine blade in a jet engine, a combustion chamber thereof, and afterburner parts thereof. In the de-sizing process 3, excess polymer coated on the woven fabric is removed.

A method according to the present invention is a hybrid treatment comprising: a CVI treatment in which a SiC matrix layer is formed on the surface of the shaped woven fabric under reduced pressure conditions; a PIP treatment in which an organic silicon polymer, as a base material, is impregnated into voids in the matrix layer and pyrolized; and a machining process in which the woven fabric is machine-tooled.

In the example shown in FIG. 1, the CVI treatment comprises a C-CVI treatment 4, two SiC-CVI treatments 5 and 8, and a SiC-CVI treatment 11 performed as necessary depending on the leak test result. In the C-CVI treatment 4, carbon, preferably graphite carbon, or boron nitride is coated on the shaped woven fabric. The thickness of the coating is preferably from 0.1 to 1.0 micrometers. As disclosed in Japanese Unexamined Patent Application, First Publication, No. Sho 63-12671, such a coating layer has a function of separating the matrix from the ceramic fibers and increasing toughness of the fibers.

The SiC-CVI treatments 5, 8, and 11 use so-called chemical vapor infiltration methods in which the woven fabric is fixed by specific formers in a furnace and is heated, methyltrichlorosilane, for example, is supplied into the furnace under reduced pressure conditions, and SiC is formed in the woven fabric. The first SiC-CVI treatment 5 is repeatedly performed as necessary until a desired volume ratio of the matrix formed by the CVI treatment is achieved. The latter SiC-CVI treatments 8 and 11 are coating treatments performed in order to form a dense matrix on the surface of the matrix formed by the PIP treatment.

The machining process 6 is performed to obtain a desired shape of the CMC article by machine tooling or surface finishing after CVI treatment. In this process, a diamond wheel, for example, is used to finish the article into a desired shape.

The PIP treatments 7 and 10 are so-called polymer impregnation and pyrolysis method including a impregnation process in which an organic silicon polymer, as a base material, is impregnated, under reduced pressure conditions, into voids in the matrix layer formed by the CVI treatment, and pyrolysis process performed after the impregnation process. The polymer is easily impregnated into the voids by performing the impregnation process under reduced pressure conditions because air in the woven fabric is evacuated. The impregnation process and the pyrolysis process are repeatedly performed as necessary until a desired density is achieved. The organic silicon polymer used in the impregnation process is preferably, for example, a polycarbosilane solution in which polycarbosilane is dissolved in xylene, polyvinylsilane, polymetallocarbosilane, and the like. By the PIP treatment in which one of these polymers is impregnated and pyrolized, the matrix having microcracks can be formed in a short period.

The impregnation process included in the PIP treatment is preferably selected from dipping, reduced pressure impregnation, and pressurized impregnation, or combination thereof. A large amount of organic silicon polymer can be impregnated in a short period by using a dipping method. An organic silicon polymer can be impregnated into minute voids by using reduced pressure impregnation. Airtightness of the article can be improved by performing reduced pressure impregnation while applying pressure in the direction along which pressure is applied in use of the article.

The leak test 9 comprises the steps of: dipping a combustion chamber, for example, formed of a CMC in water; pressurizing inside the chamber, for example, up to pressure of 0.7 MPa using nitrogen gas; trapping the gas leaked through the chamber; and measuring the volume of the gas as the amount leaked. In this case, the chamber throat should be isolated from the chamber by sealing so that the nozzle portion is not pressurized.

Fabrication process for a CMC article, a combustion chamber for example, will be explained below.

First, a woven fabric is made through the fabric manufacturing process 1, the weaving process 2, and the de-sizing process 3 as described above. In the next step, carbon is coated on the woven fabric by a C-CVI treatment 4, and then a matrix is formed in voids in the fabric by a SiC-CVI treatment 5.

In the machining process 6, the CMC is finished to the final article shape of the chamber. After this process, an organic silicon polymer is impregnated into voids in the matrix layer and pyrolized during the PIP treatment 6. Because the matrix layer (so-called CVI membrane) which had been formed on the outer surface of the woven fabric through the CVI treatment and which covers the voids has been removed by the machining process, impregnation paths are retained open, through which a sufficient amount of the organic silicon polymer can be impregnated into inside the woven fabric in the following PIP treatment 7.

After the PIP treatment 7, another SiC-CVI treatment 8 is performed on the woven fabric, by which the combustion chamber having a dense matrix coated on the surface of the previously formed matrix is obtained.

Upon completion of the SiC-CVI treatment 8, the leak test 9 is performed on the combustion chamber as a CMC article, and it is judged whether or not no-leak performance has been achieved in the judgement process 12. If no-leak performance is achieved, then the fabrication processes end, and if not, i.e., the filling factor (density) of the matrix is not sufficient, then the PIP treatment 10, the SiC-CVI treatment 11, and the leak test 9 are repeated until no-leak performance is achieved.

In the method for fabricating a CMC article according to this embodiment, a sufficient amount of the organic silicon polymer can be impregnated into the inside of the woven fabric during the PIP treatment 7 since the CVI membrane formed through the CVI treatment 5 has been removed by the machining process prior to the PIP treatment 7. As a result, the number of PIP treatments 10 repeated after the leak test 9 may be reduced down to about 20 times, whereas previously 30 to 40 times was necessary, whereby the throughput of CMCs can be greatly increased.

In addition, because the woven fabric is finished into a desired shape in the machining process 6, another finishing is not required after the PIP treatment, which contributes to further increase in the throughput of CMCs. However, when higher accuracy of the finished shape is required, depending upon the shape of the article, another machining process 15 for the final finishing may be performed between the PIP treatment 7 and the CVI treatment 8, as shown in FIG. 1.

Figure 2:
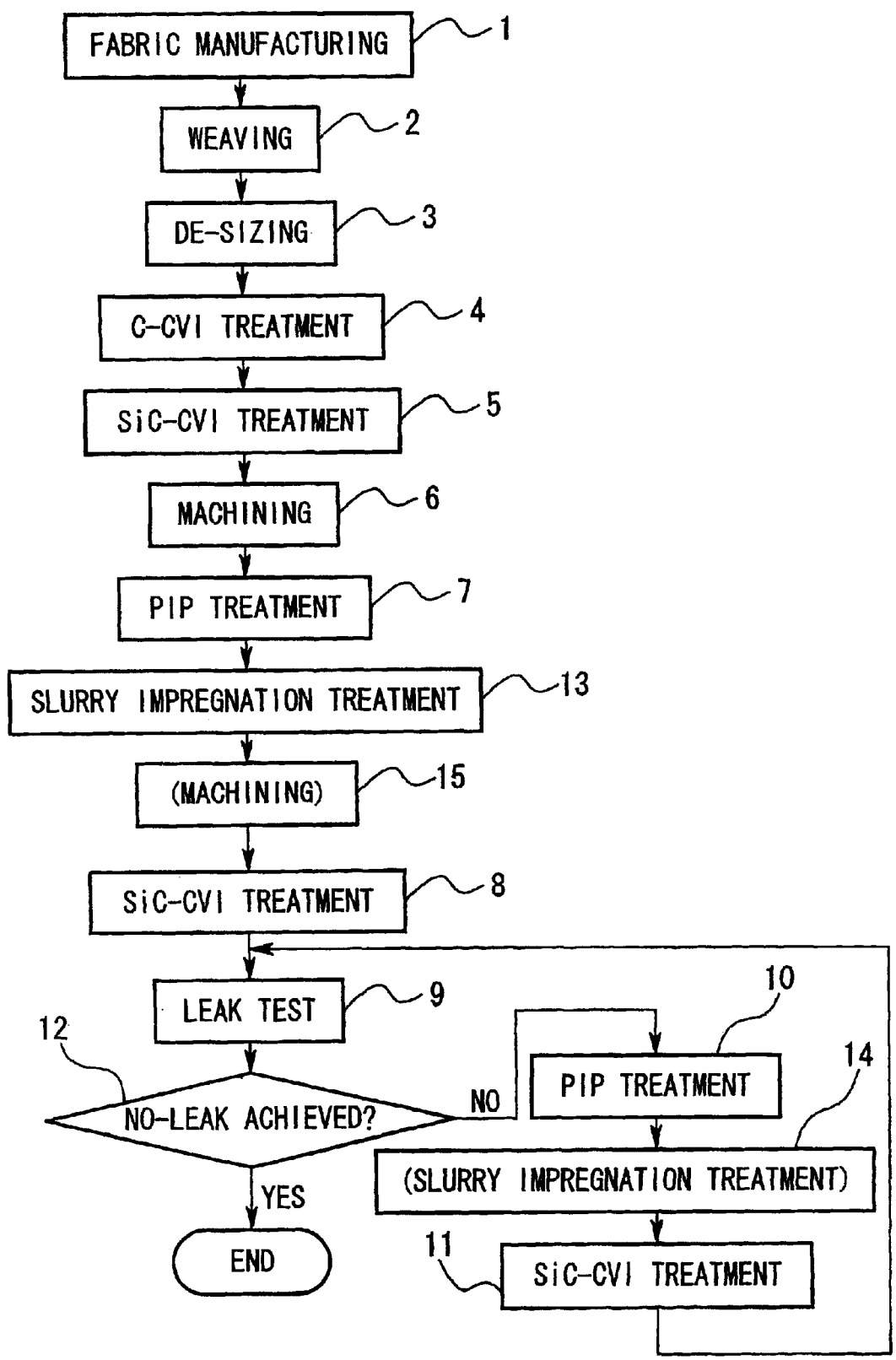
FIG. 2 is a flow diagram showing a method for fabricating a CMC article according to the second embodiment of the present invention.

The method for fabricating a CMC article according to the second embodiment of the present invention will be explained below with reference to FIG. 2. In FIG. 2, the same reference numerals are applied to the same processes as in the first embodiment, for which further description is omitted. The second embodiment differs from the first embodiment in that a slurry impregnation treatment is added.

In the method according to the second embodiment, the slurry impregnation treatment 13 is performed after the PIP treatment 7, which includes an impregnation process in which slurried substances (hereinafter abbreviated as slurry) consisting of SiC particles and polymer solution, the solution being the same as used in the PIP treatment, is impregnated, and a pyrolization process following the impregnation process. In the slurry impregnation treatment 13, the woven fabric consisting of SiC fibers into which the slurry was impregnated is dried in a vacuum condition, and then heat treatments are applied several times to it, each of which is performed at about 1000° C. for two hours in an argon environment at atmospheric pressure. The impregnation process does not have to be performed under reduced pressure conditions.

Following the slurry impregnation treatment 13, the SiC-CVI treatment 8 is performed, and then the leak test 9 is performed. If no-leak performance is achieved, then the fabrication processes end, and if not, then the PIP treatment 10, the SiC-CVI treatment 11, and the leak test 9 are sequentially repeated until no-leak performance is achieved.

When it is required that the matrix be filled locally depending on the result of the leak test 9, another slurry impregnation treatment 14 may be performed between the PIP treatment 10 and the SiC-CVI treatment 11. Alternatively, either the PIP treatment 10 or the slurry impregnation treatment 14 may be selectively performed. A higher impregnation efficiency can be obtained when the slurry impregnation treatment 14 is performed alone.

In the method for fabricating a CMC article according to this embodiment, because the slurried SiC is impregnated into the voids in the woven fabric, the filling factor of the CMC is preferably increased. As a result, the number of PIP treatments 10 repeated after the leak test 9 may be reduced to about 10 to 20 times, whereas previously 30 to 40 times was necessary, whereby the throughput of CMCs can be greatly increased.

In the method according to the above embodiment, in order to achieve no-leak performance, the machining process 6 is performed between the CVI treatment 5 and the PIP treatment 7, or the slurry impregnation treatment 13 is performed after the PIP treatment 7; however, this method is preferably applicable even in the case in which no-leak performance is not required since the number of the PIP treatments can be reduced.

In the above description about the method according to the second embodiment, the slurry impregnation treatment 13 is preferably performed after the PIP treatment 7; however, the sequence is not limited, and the slurry impregnation treatment 13 may be performed before the PIP treatment 7. In this case, the impregnation efficiency may be increased since the slurry is impregnated more easily.

As described, in the method for fabricating a CMC article according to the first aspect of the present invention, the woven fabric is machine-tooled between the CVI treatment and the PIP treatment.

In this method for fabricating a CMC, because a sufficient amount of the organic silicon polymer can be impregnated into the inside of the woven fabric during the PIP treatment, the number of PIP treatments required to achieve no-leak performance may be reduced, whereby the throughput of CMCs can be greatly increased.

In the method for fabricating a CMC article according to the second aspect of the present invention, the woven fabric is machine-finished into a desired shape in the machining process.

In this method for fabricating a CMC article, another finishing process after the PIP treatment is not required, whereby the throughput of CMCs can be further increased.

In the method for fabricating a CMC article according to the third aspect of the present invention, a slurry impregnating process is performed before or after the PIP treatment.

In this method for fabricating a CMC article, because the filling factor of the CMC article can be efficiently increased, the number of the PIP treatments required to achieve no-leak performance may be further reduced, whereby the throughput of CMCs can be further increased.

What is claimed is:

1. A method of fabricating a CMC article, comprising:

performing a CVI treatment for forming a SiC matrix layer on the surface of a woven fabric;

performing a machining process, after said CVI treatment, for machining said woven fabric so as to provide impregnation paths; and performing a PIP treatment, after said machining process, for impregnating an organic silicon polymer as a base material into voids in said matrix layer and pyrolyzing said organic silicon polymer.

2. A method according to claim 1, wherein said woven fabric is machine-finished into a desired shape in said machining process for providing impregnation paths.

3. A method according to one of claims 1 and 2, further comprising:

performing a slurry impregnating process before said PIP treatment for impregnating SiC in a slurry state into voids in said matrix layer.

4. A method according to any one of claim 1 or 2 further comprising:

performing a slurry impregnating process after said PIP treatment for impregnating SIC in a slurry state into voids in said matrix layer.

* * * * *